US011296722B2

(12) United States Patent
Basso et al.

(10) Patent No.: US 11,296,722 B2
(45) Date of Patent: *Apr. 5, 2022

(54) INTEGRATED PHYSICAL CODING SUBLAYER AND FORWARD ERROR CORRECTION IN NETWORKING APPLICATIONS

(71) Applicant: International Business Machines Corporation, Armonk, NY (US)

(72) Inventors: Claude Basso, Nice (FR); Cheng Wei Song, Beijing (CN); Fabrice Jean Verplanken, La Gaude (FR)

(73) Assignee: International Business Machines Corporation, Armonk, NY (US)

( * ) Notice: Subject to any disclaimer, the term of this patent is extended or adjusted under 35 U.S.C. 154(b) by 117 days.

This patent is subject to a terminal disclaimer.

(21) Appl. No.: 16/735,802

(22) Filed: Jan. 7, 2020

(65) Prior Publication Data

US 2020/0145022 A1 May 7, 2020

Related U.S. Application Data

(63) Continuation of application No. 16/152,479, filed on Oct. 5, 2018, now Pat. No. 10,574,262, which is a
(Continued)

(51) Int. Cl.
*H03M 13/00* (2006.01)
*H03M 13/03* (2006.01)
(Continued)

(52) U.S. Cl.
CPC ....... *H03M 13/03* (2013.01); *H03M 13/1105* (2013.01); *H03M 13/15* (2013.01);
(Continued)

(58) Field of Classification Search
CPC ...... H03M 13/03; H03M 13/11; H03M 13/15; H03M 13/1515; H03M 13/25;
(Continued)

(56) References Cited

U.S. PATENT DOCUMENTS 8,108,756 B2   1/2012  Ganga et al.
8,560,914 B2  10/2013  Li et al.
(Continued)

OTHER PUBLICATIONS

Marco Mazzini et al., "CPAK to QSFP28 Converter for Extended Performance," An IP.com Prior Art Database Technical Disclosure, IP.com No. IPCOM000225743D, Copyright 2013 Cisco Systems, Inc., IP.com Electronic Publication, Mar. 1, 2013; 6 pages.
(Continued)

*Primary Examiner* — Albert Decady
*Assistant Examiner* — Osman M Alshack
(74) *Attorney, Agent, or Firm* — Patterson + Sheridan, LLP

(57) ABSTRACT

Techniques for receiving data at a physical coding sublayer (PCS) transmit structure from a media access control (MAC) sublayer are provided. A PCS transmit structure is configured to receive data from a MAC sublayer, the PCS transmit structure comprising a first FEC hardware module that performs FEC encoding, in a first clock domain, on the data to generate FEC encoded data. Further, a PCS receive structure configured to receive the FEC encoded data from the PCS transmit structure, the PCS receive structure comprising a second FEC hardware module is configured to perform FEC decoding, in the second clock domain, on the FEC encoded data to generate FEC decoded data.

18 Claims, 4 Drawing Sheets

Related U.S. Application Data continuation of application No. 14/445,342, filed on Jul. 29, 2014, now Pat. No. 10,164,734, which is a continuation of application No. 14/319,081, filed on Jun. 30, 2014, now Pat. No. 10,164,733.

(51) Int. Cl.
| | | |
|---|---|---|
| *H04L 1/00* | (2006.01) | |
| *H03M 13/11* | (2006.01) | |
| *H03M 13/15* | (2006.01) | |
| *H04L 25/14* | (2006.01) | |
| *H04L 25/49* | (2006.01) | |
| *H04L 47/19* | (2022.01) | |
| *H03M 13/25* | (2006.01) | |
| *G11B 20/18* | (2006.01) | |
| *G06F 11/27* | (2006.01) | |

(52) U.S. Cl.
CPC ..... *H03M 13/1515* (2013.01); *H03M 13/611* (2013.01); *H04L 1/0041* (2013.01); *H04L 1/0045* (2013.01); *H04L 1/0057* (2013.01); *H04L 25/14* (2013.01); *H04L 25/49* (2013.01); *H04L 47/19* (2013.01); *G06F 11/27* (2013.01); *G11B 20/1833* (2013.01); *H03M 13/11* (2013.01); *H03M 13/25* (2013.01)

(58) Field of Classification Search
CPC ..... H03M 13/27; H03M 13/47; H04L 1/0057; H04L 1/0041; H04L 1/0045; H04L 47/19; G11B 20/1833; G06F 11/10
USPC ........................................ 714/752, 776, 784
See application file for complete search history.

(56) References Cited

U.S. PATENT DOCUMENTS

| | | | | |
|---|---|---|---|---|
| 9,049,120 | B1* | 6/2015 | Vijayaraghavan | H04L 41/0833 |
| 9,235,540 | B1* | 1/2016 | Langhammer | H04L 25/14 |
| 9,325,540 | B2 | 4/2016 | Zhang et al. | |
| 9,331,714 | B1* | 5/2016 | Yang | H04L 1/004 |
| 10,164,733 | B2 | 12/2018 | Basso et al. | |
| 10,432,218 | B2 | 10/2019 | Basso et al. | |
| 2007/0157060 | A1* | 7/2007 | Ganga | H03M 13/6312 714/752 |
| 2008/0069052 | A1* | 3/2008 | Mezer | H04L 1/0045 370/332 |
| 2008/0226294 | A1 | 9/2008 | Sakai et al. | |
| 2010/0031120 | A1 | 2/2010 | Belogolovy et al. | |
| 2010/0183035 | A1* | 7/2010 | Li | H04L 43/106 370/503 |
| 2010/0202556 | A1* | 8/2010 | Chiabrera | H04L 25/14 375/295 |
| 2010/0223535 | A1* | 9/2010 | Geng | H04L 1/0057 714/784 |
| 2011/0135312 | A1 | 6/2011 | El-Ahmadi et al. | |
| 2013/0111083 | A1* | 5/2013 | Wu | G06F 13/4291 710/52 |
| 2013/0343439 | A1 | 12/2013 | Wentroble et al. | |
| 2014/0189459 | A1* | 7/2014 | Vijayaraghavan | H03M 13/3738 714/755 |
| 2014/0199069 | A1* | 7/2014 | Garavaglia | H04Q 11/0071 398/66 |
| 2014/0212128 | A1 | 7/2014 | Hirth et al. | |
| 2015/0135041 | A1 | 5/2015 | O'Connell et al. | |
| 2015/0244649 | A1* | 8/2015 | Krakirian | H04L 49/3063 370/419 |
| 2015/0341277 | A1* | 11/2015 | Gravel | H04L 1/0002 370/468 |
| 2015/0381316 | A1 | 12/2015 | Basso et al. | |
| 2019/0036645 | A1 | 1/2019 | Basso et al. | |

OTHER PUBLICATIONS

Internet Society et al., "Managed Objects of Ethernet Passive Optical Networks (EPON) (RFC4837)," An IP.com Prior Art Database Technical Disclosure, IP.com No. IPCOM000154671D, Copyright © The IETF Trust (2007), Original Publication Date Jul. 1, 2007, IP.com Electronic Publication, Jul. 11, 2007; 93 pages.

IBM, "List of IBM Patents or Patent Applications Treated As Related," for U.S. Appl. No. 16/735,802, filed Jan. 7, 2020.

* cited by examiner

INTEGRATED PHYSICAL CODING SUBLAYER AND FORWARD ERROR CORRECTION IN NETWORKING APPLICATIONS

CROSS-REFERENCE TO RELATED APPLICATIONS

This application is a continuation of co-pending U.S. patent application Ser. No. 16/152,479, filed on Oct. 5, 2018, which is a continuation of U.S. patent application Ser. No. 14/445,342 (U.S. Pat. No. 10,164,734), filed on Jul. 29, 2014, which is a continuation of U.S. patent application Ser. No. 14/319,081 (U.S. Pat. No. 10,164,733), filed on Jun. 30, 2014. Each of the aforementioned related patent applications and patents are herein incorporated by reference in their entirety.

BACKGROUND

The present disclosure relates to reducing latency, and more specifically, to reducing latency in Ethernet applications, such as 100G Ethernet. The Ethernet physical layer is developed according to the Open Systems Interconnection (OSI) model. Several layers are defined in the various Ethernet standards, including the Physical Layer (PHY). The Ethernet Physical Coding Sublayer (PCS) is part of the Ethernet PHY layer and performs autonegotiation, coding, and other functions.

Latency is a critical parameter in many networking applications, such as financial applications. Typical Ethernet implementations follow the IEEE functional definition. The definition by the IEEE of Forward Error Correction (FEC) function for 100G Ethernet is specified generically, independent of the PCS function. The standard FEC implementation follows the classical Layered Functional Model, with a FEC sublayer situated between the PCS and Physical Medium Attachment (PMA) sublayer. The effective latency therefore is the sum of PCS latency and FEC latency. A significant part of the FEC latency is due to functions that are symmetrical with PCS functions.

SUMMARY

According to one embodiment of the present disclosure, a system is provided, comprising a physical coding sublayer (PCS) transmit structure configured to receive data from a media access control (MAC) sublayer, the PCS transmit structure comprising a first forward error-correction (FEC) hardware module. The system also includes a PCS receive structure configured to receive the FEC encoded data from the PCS transmit structure, the PCS receive structure comprising a second FEC hardware module. The first FEC hardware modules is configured to perform FEC encoding, in a first clock domain, on the data to generate FEC encoded data, wherein the PCS transmit structure is further configured to transmit the FEC encoded data from the first clock domain with a first clock cycle to a second clock domain with a second clock cycle. The second FEC hardware module is configured to perform FEC decoding, in the second clock domain, on the FEC encoded data to generate FEC decoded data.

According to another embodiment of the present disclosure, a computer program product comprising a non-transitory computer-readable storage medium having computer-readable program code embodied therewith is provided. The computer-readable program code includes computer-readable program code configured to receive data at a physical coding sublayer (PCS) transmit structure from a media access control (MAC) sublayer. The computer-readable program code also includes computer-readable program code configured to perform FEC encoding, in a first clock domain, on the data in the PCS transmit structure to generate FEC encoded data, wherein the PCS transmit structure is configured to transmit the FEC encoded data from the first clock domain with a first clock cycle to a second clock domain with a second clock cycle. Further, the computer-readable program code includes computer-readable program code configured to perform FEC decoding, in the second clock domain, on the FEC encoded data in the PCS receive structure to generate FEC decoded data.

According to another embodiment of the present disclosure, a method is provided. The method includes receiving data at a physical coding sublayer (PCS) transmit structure from a media access control (MAC) sublayer; performing FEC encoding, in a first clock domain, on the data in the PCS transmit structure to generate FEC encoded data; transmitting the FEC encoded data from the first clock domain with a first clock cycle to a second clock domain with a second clock cycle; and performing FEC decoding, in the second clock domain, on the FEC encoded data in the PCS receive structure to generate FEC decoded data.

BRIEF DESCRIPTION OF THE SEVERAL VIEWS OF THE DRAWINGS

So that the manner in which the above recited aspects are attained and can be understood in detail, a more particular description of embodiments of the disclosure, briefly summarized above, may be had by reference to the appended drawings.

It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
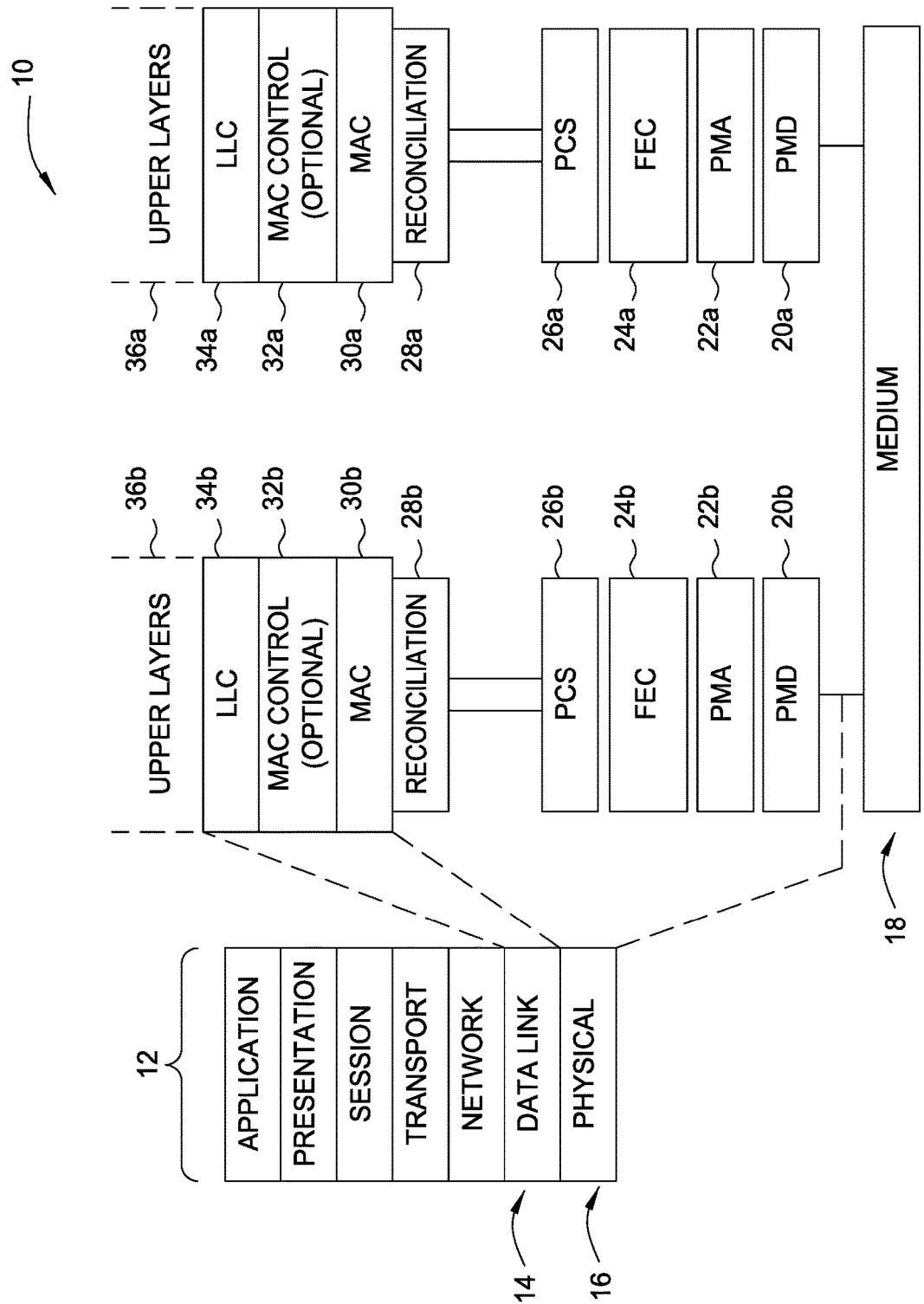
FIG. 1 illustrates a conceptual block diagram of an Ethernet networking application according to one embodiment described herein.

As transmit speeds of Ethernet applications have increased, such as 40G and 100G Ethernet, the complexity of various cores, or sublayers, have increased as well. One function of the PCS is to encode/decode data and perform clock compensation functions. In Ethernet applications, data is transmitted from the MAC layer to the PHY layer. The PHY layer consists of multiple sublayers. The first sublayer, or core, of the PHY layer is the PCS. In standard Ethernet implementations, data is transmitted from the clock domain of the MAC sublayer (the MAC Interface (MI) clock) to the clock domain of the PCS (the PMA clock). In these implementations, a FEC sublayer is inserted between the PCS and PMA sublayer to provide error correction capabilities. The IEEE 802.3 protocol allows the FEC sublayer to be on a separate chip than the PCS, or on the same chip as the PCS.

Other sublayers may also be implemented on separate chips or implemented as various combinations on chips. Current techniques that implement the PCS and the FEC on the same chip introduce redundancies to the system.

The effective latency of the PCS sublayer and the FEC sublayer is the sum of PCS latency and FEC latency. However, a significant part of the FEC latency is due to functions that are symmetrical with PCS functions. As one example, the FEC sublayer operates on 66-bit data. The PCS encodes 66-bit data into 32-bit blocks. Therefore, the FEC sublayer has to undo this 32-bit encoding to retrieve the 66-bit data. In accordance with some embodiments of the present disclosure, implementing FEC functions on the PCS eliminates these encoding/decoding steps, which in turn reduces latency. In some embodiments, redundancies on the transmit side of the PCS caused by lane block synchronization, alignment lock and deskew, lane reorder, and/or alignment removal can be eliminated, which further reduces latency. In addition, alignment markers (AM) used for transmitting data between the PCS and the FEC may be eliminated. However, in one embodiment, alignment markers for deskew are still used. On the receive side of the PCS, similar functional redundancies can be eliminated, which further reduces latency.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

FIG. 1 illustrates a conceptual block diagram 10 of an Ethernet application. On the left side of FIG. 1 are the OSI Model layers 12. The OSI Model characterizes and standardizes the internal functions of a communications system by partitioning it into abstraction layers. The PHY layer 16 is shown at the bottom of the OSI Model 12, with the Data Link layer 14 situated above the PHY layer 16.

Elements 20a to 36a and 20b to 36b illustrate various sublayers of an Ethernet application. Elements 20a to 36a represent a transmit side, and elements 20b-36b represent a receive side. A medium 18 connects the transmit and receive sides. Different elements, layers, or sublayers may reside on different chips in certain embodiments. In some embodiments various combinations of the elements may be implemented together on a single chip.

Data may travel through block diagram 10 from the transmit side to the receive side. Data traverses the upper layers 36a, which may comprise the application layer, transport layer, network layer, etc. Data then reaches the data link layer 12, comprising a logical link control (LLC) 34a, an optional MAC control 32a, and a MAC sublayer 30a. Data then enters the PHY layer 12, comprising Reconciliation 28a, a PCS 26a, a FEC sublayer 24a, a PMA sublayer 22a, and Physical Medium Dependent sublayer (PMD) 20a. Reconciliation 28a processes fault messages and may perform other operations. In certain embodiments of the present disclosure, FEC operations are integrated with PCS 26a and, therefore a separate FEC sublayer 24a is not utilized. The PCS 26a transmit structure with FEC operations is illustrated in further detail in FIG. 2 below.

Data travels from the transmit side to the receive side via medium 18, which may comprises a High-Speed SerDes (serializer/deserializer), or HSS. On the receive side, represented by elements 20b-36b, the data moves through the various sublayers in the opposite direction from the transmit side, beginning with the PMD 20b and traversing up the figure, eventually reaching the upper layers 36b. On the receive side, as on the transmit side, FEC functions may be integrated with PCS 26b instead of being performed in a separate sublayer. The PCS 26b receive structure with FEC operations is illustrated in further detail in FIG. 3 below.

Figure 2:
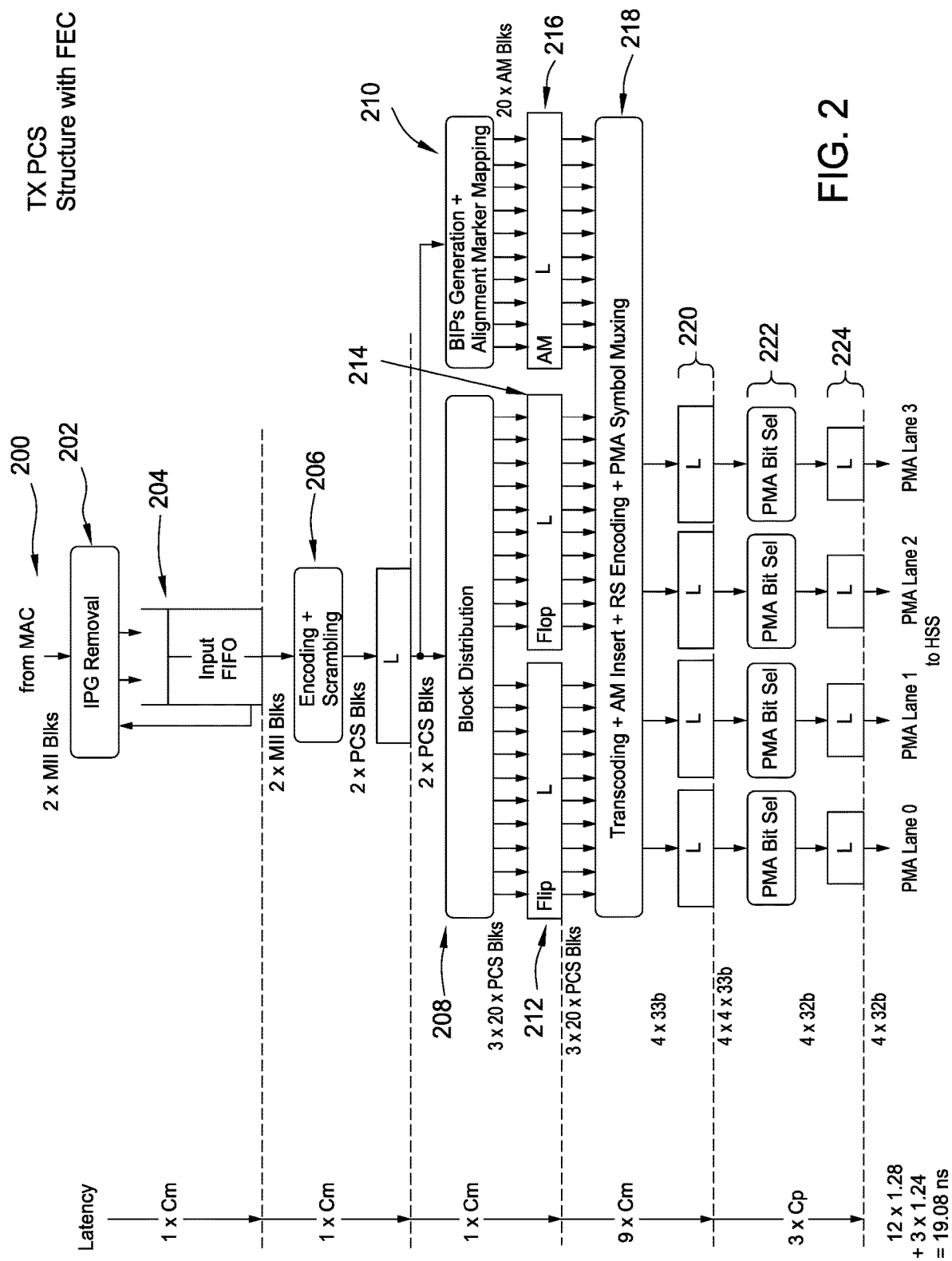
FIG. 2 illustrates a transmit (TX) PCS structure according to one embodiment described herein.

FIG. 2 illustrates a PCS transmit (TX) structure 200 with FEC capabilities according to one embodiment of the present disclosure. On the left side of FIG. 2, an axis illustrates approximate latencies for various processes performed on the PCS TX structure 200. An MI clock cycle is represented by Cm, and a PMA clock cycle is represented by Cp. As shown on the latency axis, the top four processes, separated by horizontal dashed lines, are labeled with Cm, and therefore those processes occur in the MI clock domain. The bottom process takes 3 Cp cycles, and therefore this process occurs in the PMA clock domain.

In a PCS core for 40G or 100G Ethernet, a data stream is received from the MAC sublayer as 2 Media Independent Interface (MII) blocks, as shown at the top of FIG. 2. These MII blocks comprise 64 bits of data plus 8 bits of control code. Interpacket gap (IPG) Removal 202 is performed after the MII blocks are received. Alignment markers of a size of 20 blocks are inserted into an input FIFO 204 with a depth of 20 blocks.

Encoder 206 encodes the MII blocks into two 66-bit PCS blocks. To do so, encoder 206 encodes the 64 bits of MAC data and 8 bits of MAC control data into a 64-bit block that includes a 2-bit preamble to create the 66-bit PCS block. Encoder 206 performs a scrambling function to create a roughly equal number of 1s and 0s on the physical lane. The scrambling function works to prevent a long string of all 1s or all 0s being transmitted. As shown on the latency axis in FIG. 2, the encoding and scrambling functions take approximately 1 MI clock cycle to complete.

The next step comprises Block Distribution 208 and Bit Interleaved Parity (BIP) Generation, which provides a parity check. Further, alignment markers (AM) are utilized on the receive side of the PCS sublayer (illustrated in FIG. 3 below) to synchronize the PCS blocks transmitted amongst the various PMA lanes 224. Parity bits also accompany the alignment markers to perform parity checks. Alignment markers allow the receive side of the PCS sublayer to identify the PCS blocks as the blocks are received on the receive side from the PMA lanes 224 so that the PCS blocks can be reordered and put into the proper order. Alignment markers are 66-bit blocks inserted into the stream of PCS blocks in each PMA lane.

For each Cp clock cycle in a PCS transmit structure 200, 32 bits of data are transmitted on each PMA lane 224. Multiplexer 218 uses muxing logic to prepare for converting the 66-bit PCS blocks to 32 bits. Block distribution 208 transmits 66-bit PCS blocks to flip latch 212 and flop latch 214. Alignment marker generator 210 generates 20 AM blocks stored in AM register 216. Alignment marker generator 210 also generates the BIP bits described above. At every clock cycle, the muxing logic in multiplexer 218 chooses 20 blocks from three sources: the flip latch 212, the flop latch 214, and the AM register 216.

Multiplexer 218 performs alignment marker insertion by interleaving the AM blocks with the PCS blocks. In addition, FEC functions are performed by the Multiplexer 218 in this example embodiment. Transcoding, Reed-Solomon Encoding, and PMA Symbol Multiplexing can be performed in about 9 MI clock cycles as shown in FIG. 1. In certain embodiments of a TX PCS structure without FEC, this multiplexing step also comprises 9 MI clock cycles. Therefore, performing these FEC functions at this point does not introduce extra latency into the system. In fact, the overall latency of the system is reduced because the data does not have to be transmitted to a separate FEC sublayer for FEC processing.

After FEC functions are performed, the interleaved AM and PCS blocks are output by Multiplexer 218 to a gearbox 220 for each PMA lane 224. In this example embodiment, four PMA lanes 224 are illustrated. In other embodiments, a different number of PMA lanes 224 may be used.

As seen on the latency axis on the left side of FIG. 2, data crosses from the MI clock domain (Cm) to the PMA clock domain (Cp) when gearbox 220 sends the data to PMA Bit Select 222. Because the MI and PMA clock domains have a fixed ratio, 33 PMA clock cycles pass for every 32 MI clock cycles that pass. Therefore, gearbox 220 (in the MI clock domain) sends data to PMA Bit Select 222 (in the PMA clock domain) during 32 of the 33 PMA clock cycles. At every PMA clock cycle, PMA Bit Select 222 receives 33 bits of data. However, the PMA Bit Select 222 forwards only 32 of the 33 bits of data on the PMA lane 224 during each clock cycle. Therefore, there is one bit left over on each PMA lane 224 for each Cm clock cycle. After 32 Cm clock cycles, a full 32 bit block of data will be left over. Because the PMA clock domain has 33 clock cycles for every 32 cycles of the MI clock domain no data is received from the MI clock domain on the 33$^{rd}$ PMA clock cycle, and thus, the leftover 32 bits of data can be sent out during the 33$^{rd}$ clock cycle of the PMA domain. Data on the PMA lanes 224 can then be transmitted to an HSS where the data is transmitted to the receive side of the PCS, as illustrated in FIG. 3 below.

As seen on the latency axis in the example embodiment of FIG. 2, the total latency of the PCS TX structure 200, including FEC functions, is approximately 12 MI clock cycles and 3 PMA clock cycles, which introduces about 19 ns of latency on the transmit side. This amount of latency is an improvement over standard Ethernet implementations that implement FEC functions on a separate sublayer.

Figure 3:
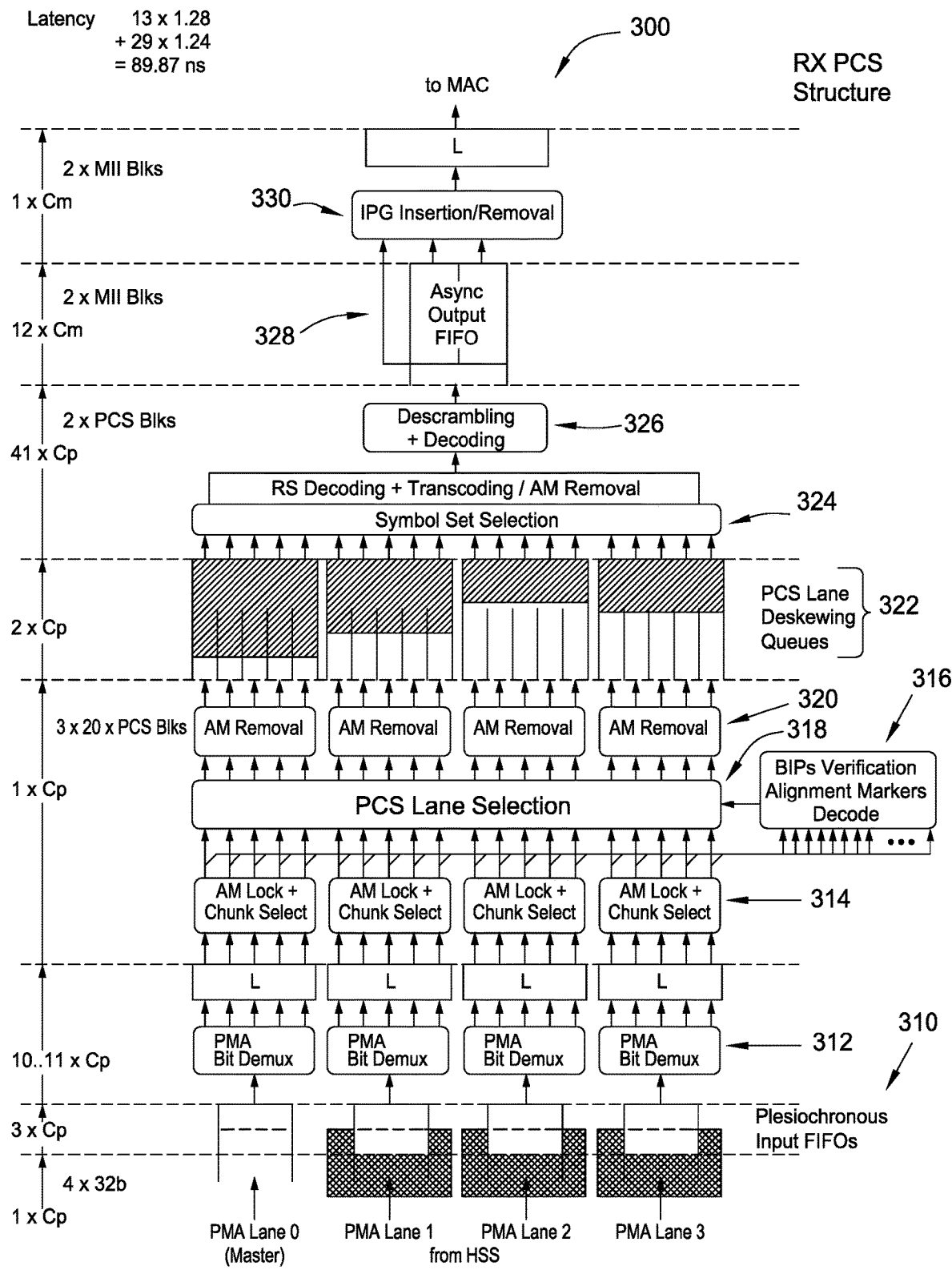
FIG. 3 illustrates a receive (RX) PCS structure according to one embodiment described herein.

Referring now to FIG. 3, a PCS RX structure 300 with FEC capabilities is illustrated according to one embodiment of the present disclosure. On the left side of FIG. 3, an axis illustrates approximate latencies for various processes performed on the PCS RX structure 300. As with the TX structure 200, an MI clock cycle is represented by Cm, and a PMA clock cycle is represented by Cp. As shown on the latency axis, the top two processes, separated by horizontal dashed lines, are labeled with Cm, and therefore those processes occur in the MI clock domain. The bottom six processes are labeled with Cp, and therefore those processes occur in the PMA clock domain.

Starting at the bottom of FIG. 3, 32-bit blocks of data are received from an HSS on four PMA lanes. The operations at the bottom of FIG. 3 are performed in the PMA clock domain, as illustrated on the latency axis. In one embodiment, the transmissions on the PMA lanes are not completely in sync. In other words, the four lanes do not necessarily have a known relationship for their respective clock cycles, so data transmitted on the PMA lanes cannot be sent directly to the next function. First, the data must be synchronized. Therefore, plesiochronous input FIFOs 310 are used.

In the Ethernet protocol, the latencies between different PMA lanes are not necessarily the same. That is, an alignment marker on PMA lane 0 may be received at a different time than an alignment marker on PMA lane 1, 2, or 3. In addition, as an example, the time difference between a first alignment marker on PMA lane 0 and a first alignment marker on PMA lane 1 may be 6 ns. For the second alignment markers on PMA lane 0 and lane 1, the difference may increase to 10 ns or decrease to 2 ns. There may be a skew variance between the lanes of approximately 4 ns.

Some amount of skew tolerance is defined in the Ethernet protocol. The maximum skew variance to support according to the protocol is 4 ns. Because of this potential skew variance, the data cannot be treated as if it is from the same clock domain. However, the plesiochronous FIFOs 310 can move the data on PMA lanes 1, 2, and 3 from their clock domains to the clock domain of line 0, so all the data can then be considered as coming from the same clock domain. The plesiochronous FIFOs 310 are therefore used to synchronize data that is not in sync by adjusting for skew variance. The process of synchronizing the data using plesiochronous FIFOs 310 can take approximately 3 PMA clock cycles, as illustrated on the latency axis on the left side of FIG. 3.

The next step on the receive side 300 is PMA Bit Demux 312. Because multiplexing was performed on the transmit side, the Demux 312 performs demultiplexing on the receive side 300. As shown on the latency axis on the left side of FIG. 3, the demultiplexing operations can take approximately 10 to 11 PMA clock cycles.

After demultiplexing, AM lock and chunk select functions 314 reorder the data using the received alignment marker blocks. In addition, BIP Verification logic 316 performs parity checks and PCS Lane Selection logic 318 distributes PCS blocks amongst the transmission lanes. In some embodiments, alignment marker removal modules 320 strip the AM blocks from the data received from the PCS TX structure before the data reaches PCS Lane Deskewing Queues 322. However, in this PCS structure 300 with integrated FEC functions, alignment marker removal is performed in block 324 as shown—i.e., the AM Removal modules 320 are omitted from the structure 300. Therefore, AM removal is not performed before deskewing in this example embodiment, but instead is performed after deskewing.

For PCS lane deskewing, the PCS Lane Deskewing Queues 320 may include 20 lanes formed into four groups. Because the alignment markers are received at different points in time, different levels are shown in the queues 322 in FIG. 3 to represent different levels of data. The position of the data boundary is therefore variable from lane-to-lane or from group-to-group (i.e., the skew). The queues 322 remove the skew so the 20 lanes of data can be read out on a single clock cycle with all the lanes aligned with one another. Approximately 2 PMA clock cycles are needed to perform this deskewing operation as shown in the latency axis.

Coding Module 324 performs FEC operations, beginning with selecting a symbol set for encoding. Coding module 324 also performs transcoding, which compresses the data. Then, FEC functions such as Reed-Solomon Decoding are performed in module 324 in this example embodiment. Alignment marker removal occurs at this step as well. Descrambler 326 then performs descrambling and decoding functions to reverse the encoding and scrambling performed in the PCS TX structure 200 illustrated in FIG. 2. In one embodiment, two PCS blocks are descrambled and decoded by Descrambler 326 in parallel. The symbol set selection, transcoding, FEC operations, alignment marker removal, and descrambling operations may take approximately 41 PMA clock cycles as shown on the latency axis in FIG. 3.

The Descrambler 326 sends MII blocks to the Asynchronous Output FIFO 328 which is part of the MI clock domain. Therefore, the data crosses from the PMA clock domain to the MI clock domain at this point, where the descrambler 326 outputs two MII blocks. In one embodiment, the asynchronous FIFO 328 on the receive side 300 is larger than the asynchronous FIFO 204 on the transmit side 200 shown in FIG. 2. For example, some data received from the PMA clock domain on the receive side may be redundant data that is deleted to keep the throughput to the MI clock domain consistent. Asynchronous FIFO 328 has a depth of 20 blocks to absorb a glitch caused by the removal of alignment markers, plus one block to accommodate throughput differences between the PMA and the MI clock domains. This process can take approximately 12 MI clock cycles, as shown on the latency axis.

IPG Insertion/Removal module 330 performs IPG functions before the data is sent to the MAC sublayer through a MI interface. This process takes approximately 1 MI clock cycle.

In the example embodiment of FIG. 3, the total latency shown on the latency axis is approximately 13 MI clock cycles and 59 PMA clock cycles, which introduces about 90 ns of latency on the receive side 300. Therefore, as shown in FIGS. 2 and 3, the total latency of the PCS core is about 109 ns. Latency in standard Ethernet implementations that implement FEC functions may reach over 500 ns, and therefore embodiments of the present disclosure provide a substantial improvement.

Multiple implementations of the various cores may be used and still fall within the scope of this disclosure. For example, a high-speed SerDes core may or may not be used. As another example, the PCS plus FEC logic may be a fixed implementation to optimize area and latency. In other embodiments, a configurable PCS or PCS plus FEC core may be used. A PCS plus FEC plus SerDes core may also be implemented. Channel quality may determine an ideal implementation. A high channel quality may allow the PCS core to connect directly to the SerDes core, although muxing may also be needed in that configuration. The overall areas and latencies may vary depending on which configuration is implemented.

Figure 4:
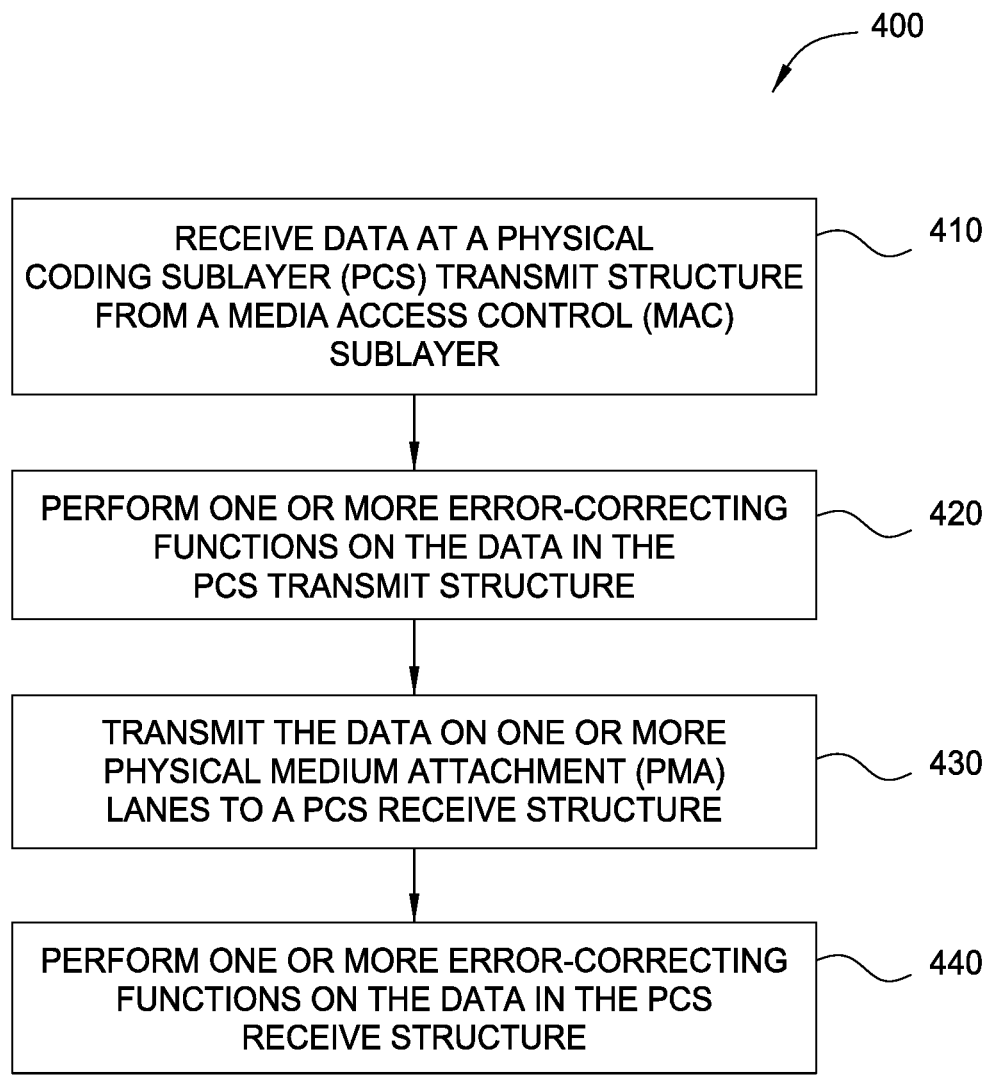
FIG. 4 is a flow diagram of method steps for reducing latency in Ethernet applications, according to one embodiment described herein.

FIG. 4 is a flow diagram of method steps 400 for reducing latency in Ethernet applications, according to one embodiment of the present disclosure. Although the method steps are described in conjunction with FIGS. 1-3, persons skilled in the art will understand that any system configured to perform the method steps, in any order, falls within the scope of the present disclosure. In various embodiments, the hardware and/or software elements described above in FIGS. 1-3 can be configured to perform the method steps of FIG. 4.

As shown, a method 400 begins at step 410, where data is received at a PCS transmit structure from a MAC sublayer. In this example embodiment, data is received in the form of MII blocks.

At step 420, one or more error-correcting functions are performed on the data in the PCS transmit structure. As described with respect to FIG. 2 above, these functions may include a FEC sub-function such as transcoding and/or Reed-Solomon Encoding.

At step 430, data is transmitted on one or more PMA lanes to a PCS receive structure. Any suitable number of lanes may be used. In some embodiments, a high-speed SerDes may be used to transmit the data.

At step 440, one or more error-correcting functions are performed on the data in the PCS receive structure. As described with respect to FIG. 3 above, these functions may include FEC sub-functions such as transcoding and/or Reed-Solomon Decoding.

Latency is reduced in certain of the above-described embodiments by implementing FEC and PCS functions in a single piece of logic. FEC sub-functions can be performed between selected PCS sub-functions. Embodiments of the present disclosure can optimize both silicon area and latency. Cost and power dissipation may also be optimized in certain embodiments. In the PCS transmit structure, certain embodiments can perform FEC sub-functions like transcoding and Reed-Solomon encoding. On the receive side, certain embodiments can perform FEC sub-functions like transcoding and Reed-Solomon decoding.

While the foregoing is directed to embodiments of the present disclosure, other and further embodiments of the disclosure may be devised without departing from the basic scope thereof, and the scope thereof is determined by the claims that follow.

What is claimed is:

1. A system comprising:
a physical coding sublayer (PCS) transmit structure configured to receive data from a media access control (MAC) sublayer, the PCS transmit structure comprising a first forward error-correction (FEC) hardware module configured to:
perform FEC encoding, in a first clock domain of the MAC sublayer, on the data to generate FEC encoded data, wherein the first clock domain comprises a MAC Interface (MI) clock domain;
wherein the PCS transmit structure is further configured to transmit the FEC encoded data from the first clock domain with a first clock cycle to a second clock domain with a second clock cycle, wherein the second clock domain corresponds to a physical medium attachment (PMA) sublayer and comprises a PMA clock domain; and
a PCS receive structure configured to receive the FEC encoded data from the PCS transmit structure, the PCS receive structure comprising a second FEC hardware module configured to:
perform FEC decoding, in the second clock domain, on the FEC encoded data to generate FEC decoded data.

2. The system of claim 1, wherein the first FEC hardware module performs Reed-Solomon encoding on one or more alignment markers and the data.

3. The system of claim 1, wherein the second FEC hardware module performs Reed-Solomon decoding on the FEC encoded data.

4. The system of claim 1, further comprising:
one or more physical media attachment (PMA) lanes configured to transmit the FEC encoded data from the PCS transmit structure to the PCS receive structure.

5. The system of claim 1, further comprising:
one or more deskewing queues on the PCS receive structure, the one or more deskewing queues configured to deskew the FEC encoded data before one or more alignment markers are removed from the FEC decoded data.

6. The system of claim 1, wherein the PCS transmit structure further comprises an encoder configured to encode, in the first clock domain, the data received from the MAC sublayer into PCS blocks before performing FEC encoding on the data; and
wherein the PCS receive structure further comprises a decoder configured to decode, in the second clock domain, the FEC decoded data into MAC blocks, wherein the FEC decoded data is received after FEC decoding is performed on the data by the second FEC hardware module.

7. A computer program product comprising a non-transitory computer-readable storage medium having computer-readable program code embodied therewith, the computer-readable program code comprising:
computer-readable program code configured to receive data at a physical coding sublayer (PCS) transmit structure from a media access control (MAC) sublayer;
computer-readable program code configured to perform forward error-correction (FEC) encoding, in a first clock domain of the MAC sublayer, on the data to generate FEC encoded data, wherein the PCS transmit structure is configured to transmit the FEC encoded data from the first clock domain with a first clock cycle to a second clock domain with a second clock cycle, wherein the first clock domain comprises a MAC Interface (MI) clock domain, and wherein the second clock domain corresponds to a physical medium attachment (PMA) sublayer and comprises a PMA clock domain; and
computer-readable program code configured to perform FEC decoding, in the second clock domain, on the FEC encoded data to generate FEC decoded data.

8. The computer program product of claim 7, further comprising:
computer-readable program code configured to perform Reed-Solomon encoding on one or more alignment markers and the data in the PCS transmit structure.

9. The computer program product of claim 7, wherein the PCS transmit structure further comprises an encoder configured to encode, in the first clock domain, the data received from the MAC sublayer into PCS blocks before performing FEC encoding on the data; and
wherein the PCS receive structure further comprises a decoder configured to decode, in the second clock domain, the FEC decoded data into MAC blocks, wherein the FEC decoded data is received after FEC decoding is performed on the data by the second FEC hardware module.

10. The computer program product of claim 7, the computer-readable program code further comprising:
computer-readable program code configured to insert one or more alignment markers in the data in the PCS transmit structure; and
computer-readable program code configured to remove the one or more alignment markers from the FEC decoded data.

11. A method comprising:
receiving data at a physical coding sublayer (PCS) transmit structure from a media access control (MAC) sublayer;
performing forward error-correction (FEC) encoding, in a first clock domain of the MAC sublayer, on the data in the PCS transmit structure to generate FEC encoded data, wherein the first clock domain comprises a MAC Interface (MI) clock domain;
transmitting the FEC encoded data from the first clock domain with a first clock cycle to a second clock domain with a second clock cycle, wherein the second clock domain corresponds to a physical medium attachment (PMA) sublayer and comprises a PMA clock domain; and
performing FEC decoding, in the second clock domain, on the FEC encoded data in the PCS receive structure to generate FEC decoded data.

12. The method of claim 11, wherein performing the FEC encoding comprises performing Reed-Solomon encoding on one or more alignment markers and the data.

13. The method of claim 11, wherein performing the FEC decoding comprises performing Reed-Solomon decoding on the FEC encoded data.

14. The method of claim 11, wherein performing the FEC encoding comprises performing the FEC encoding on one or more 66-bit PCS blocks.

15. The method of claim 11, wherein transmitting the FEC encoded data comprises transmitting the FEC encoded data on a high-speed serializer/deserializer.

16. The method of claim 11, wherein the FEC encoded data is received at the PCS receive structure in one or more plesiochronous input first-in first-outs (FIFOs).

17. The method of claim 11, wherein the PCS transmit structure further comprises an encoder configured to encode, in the first clock domain, the data received from the MAC sublayer into PCS blocks before performing FEC encoding on the data; and
wherein the PCS receive structure further comprises a decoder configured to decode, in the second clock domain, the FEC decoded data into MAC blocks, wherein the FEC decoded data is received after FEC decoding is performed on the data by the second FEC hardware module.

18. The method of claim 11, the method further comprising:
inserting one or more alignment markers in the data in the PCS transmit structure; and
removing the one or more alignment markers from the FEC decoded data.

* * * * *